(12) United States Patent
Nagami et al.

(10) Patent No.: US 10,763,126 B2
(45) Date of Patent: Sep. 1, 2020

(54) ETCHING APPARATUS AND ETCHING METHOD

(71) Applicant: TOKYO ELECTRON LIMITED, Tokyo (JP)

(72) Inventors: Koichi Nagami, Miyagi (JP); Kazuya Nagaseki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/393,261

(22) Filed: Apr. 24, 2019

(65) Prior Publication Data
US 2019/0333739 A1    Oct. 31, 2019

(30) Foreign Application Priority Data

Apr. 27, 2018    (JP) .................................. 2018-087214

(51) Int. Cl.
| | |
|---|---|
| H01L 21/3213 | (2006.01) |
| H01J 37/32 | (2006.01) |
| H01L 21/3065 | (2006.01) |
| H01L 21/14 | (2006.01) |
| H01L 21/67 | (2006.01) |

(52) U.S. Cl.
CPC .. *H01L 21/32136* (2013.01); *H01J 37/32027* (2013.01); *H01J 37/32165* (2013.01); *H01J 37/32568* (2013.01); *H01L 21/14* (2013.01); *H01L 21/3065* (2013.01); *H01L 21/67069* (2013.01); *H01J 2237/24564* (2013.01); *H01J 2237/334* (2013.01); *H01J 2237/3341* (2013.01)

(58) Field of Classification Search
None
See application file for complete search history.

(56) References Cited

U.S. PATENT DOCUMENTS

| | | | |
|---|---|---|---|
| 2009/0194508 A1* | 8/2009 | Ui | ..................... H01J 37/32045 216/67 |
| 2015/0162223 A1* | 6/2015 | Ui | ........................... H01L 22/26 438/10 |

FOREIGN PATENT DOCUMENTS

JP    2008-053516 A    3/2008

* cited by examiner

*Primary Examiner* — Jiong-Ping Lu
(74) *Attorney, Agent, or Firm* — Rothwell, Figg, Ernst & Manbeck, P.C.

(57) ABSTRACT

An etching apparatus includes: a placement table serving as a lower electrode and configured to place a workpiece to be subjected to an etching processing thereon; a DC power supply configured to generate a negative DC voltage applied to the placement table; and a controller configured to: periodically apply a negative DC voltage to the placement table from the DC power supply when the etching processing on the workpiece placed on the placement table is initiated, and decrease a frequency of the negative DC voltage applied to the placement table with an elapse of processing time of the etching processing.

8 Claims, 4 Drawing Sheets

ETCHING APPARATUS AND ETCHING METHOD

CROSS-REFERENCE TO RELATED APPLICATIONS

This application is based on and claims priority from Japanese Patent Application No. 2018-087214, filed on Apr. 27, 2018 with the Japan Patent Office, the disclosure of which is incorporated herein in its entirety by reference.

TECHNICAL FIELD

The present disclosure relates to an etching apparatus and an etching method.

BACKGROUND

An etching apparatus that performs an etching processing on a workpiece (e.g., a semiconductor wafer) using plasma has been known in the related art. Such an etching processing apparatus includes a placement table within a processing container that is designed to be capable of forming a vacuum space therein. The placement table is configured to place a workpiece therein and also functions as an electrode of the etching apparatus. In the etching processing apparatus, an etching processing using plasma is performed on a workpiece placed on the placement table by applying, for example, a predetermined radio-frequency power to the placement table. In addition, in the etching apparatus, radio-frequency power may be applied to the placement table for bias purpose when the etching processing is performed using plasma. By applying radio-frequency power to the placement table for bias purpose, the ions in the plasma are drawn into the workpiece, and holes and grooves are efficiently formed in the workpiece.

In recent years, an aspect ratio required for holes or grooves formed in a workpiece by an etching processing is increasing. In an etching processing of holes or grooves having a high aspect ratio, as the etching processing progresses, since the rectilinearity of the ions drawn into the workpiece decreases, etching characteristics deteriorate. It is known that the rectilinearity of the ions drawn into the workpiece becomes higher as the frequency of the radio-frequency power for bias applied to the placement table becomes lower.

Thus, there has been known a technique in which a plurality of radio-frequency power supplies for generating a plurality of radio-frequency powers for bias having different frequencies are mounted in an etching apparatus and the frequency of the radio-frequency power for bias is changed by selectively switching connection between the plurality of radio-frequency power supplies and the placement table during the etching processing. See, for example, Japanese Patent Laid-open Publication No. 2008-053516.

SUMMARY

An etching apparatus according to an aspect of the present disclosure includes: a placement table serving as a lower electrode and configured to place a workpiece to be subjected to an etching processing; a DC power supply configured to generate a negative DC voltage applied to the placement table; and a controller configured to: periodically apply a negative DC voltage to the placement table from the DC power supply when the etching processing on the workpiece placed on the placement table is initiated, and decrease a frequency of the negative DC voltage applied to the placement table with an elapse of processing time of the etching processing.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
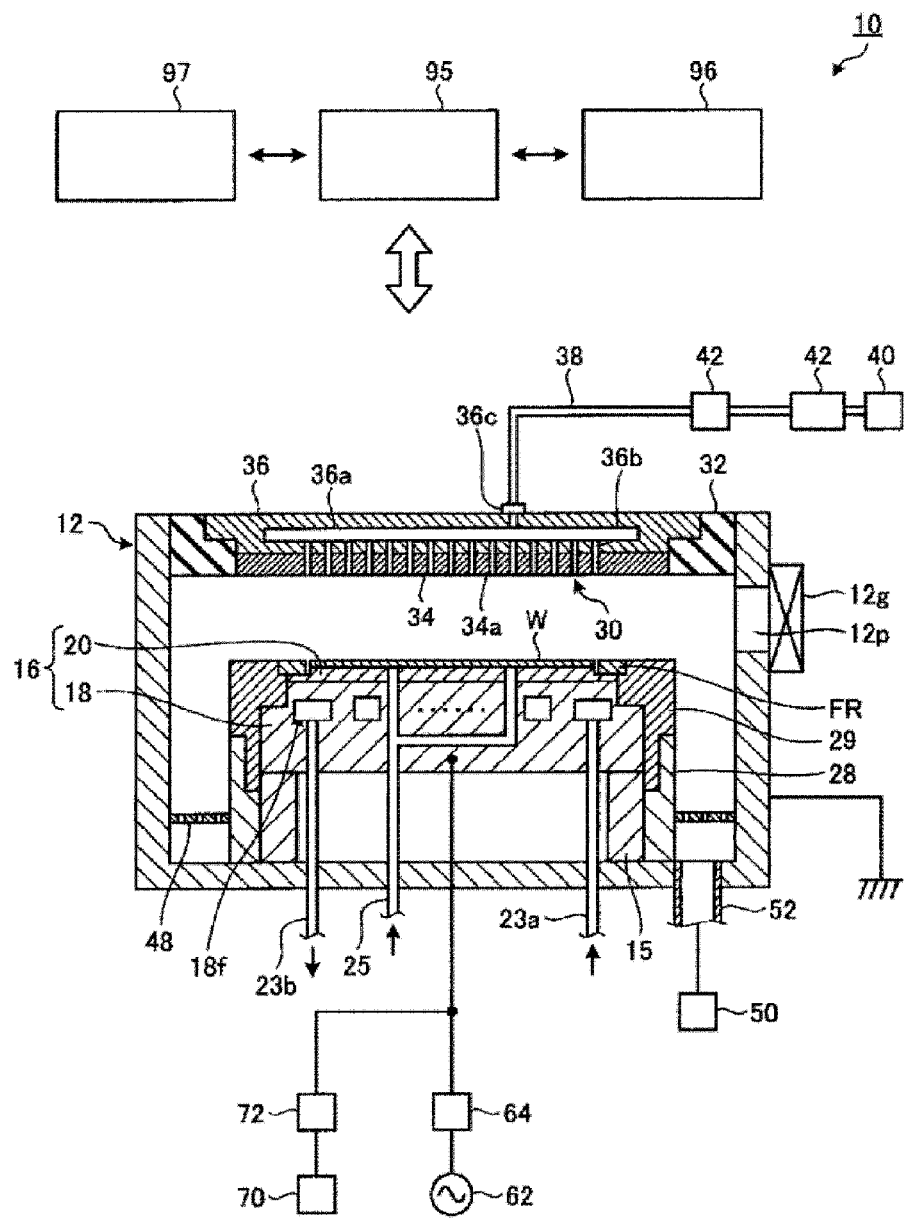
FIG. 1 is a schematic cross-sectional view illustrating a schematic configuration of an etching apparatus according to a first embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, various embodiments will be described in detail with reference to the drawings. In each of the drawings, the same or corresponding components will be denoted by the same reference numerals.

An etching apparatus that performs an etching processing on a workpiece (e.g., a semiconductor wafer) using plasma has been known in the related art. Such an etching processing apparatus includes a placement table within a processing container that is designed to be capable of forming a vacuum space therein The placement table is configured to place a workpiece therein and also functions as an electrode of the etching apparatus. In the etching processing apparatus, an etching processing using plasma is performed on a workpiece placed on the placement table by applying, for example, a predetermined radio-frequency power to the placement table. In addition, in the etching apparatus, radio-frequency power may be applied to the placement table for bias purpose when the etching processing is performed using plasma. By applying radio-frequency power to the placement table for bias purpose, the ions in the plasma are drawn into the workpiece, and holes and grooves are efficiently formed in the workpiece.

In recent years, an aspect ratio required for holes or grooves formed in a workpiece by an etching processing is increasing. In an etching processing of holes or grooves having a high aspect ratio, as the etching processing progresses, since the rectilinearity of the ions drawn into the workpiece decreases, etching characteristics deteriorate. It is known that the rectilinearity of the ions drawn into the workpiece becomes higher as the frequency of the radio-frequency power for bias applied to the placement table becomes lower.

Thus, there has been known a technique in which a plurality of radio-frequency power supplies for generating a plurality of radio-frequency powers for bias having different frequencies are mounted in an etching apparatus and the frequency of the radio-frequency power for bias is changed by selectively switching connection between the plurality of radio-frequency power supplies and the placement table during the etching processing.

However, when the plurality of radio-frequency power supplies are mounted in the etching apparatus, the apparatus configuration of the etching apparatus becomes complicated. For this reason, it is expected that the deterioration of etching characteristics is suppressed with a simple apparatus configuration.

First Embodiment

[Configuration of Etching Apparatus]

FIG. 1 is a schematic cross-sectional view illustrating a schematic configuration of an etching apparatus 10 according to a first embodiment. The etching apparatus 10 includes a processing container 12. The processing container 12 has a substantially cylindrical shape. The processing container 12 defines a processing space in which plasma is generated. The processing container 12 is made of, for example, aluminum. The processing container 12 is connected to a ground potential. On the inner wall surface of the processing container 12, a plasma-resistant film is formed. The film may be a film formed by an anodic oxidation processing or a ceramic film such as, for example, a film formed of yttrium oxide. In addition, a passage 12p is formed in the side wall of the processing container 12. When a wafer W as the workpiece is loaded into the processing container 12 and when the wafer W is unloaded from the processing container 12, the wafer W passes through the passage 12p. In order to open and close the passage 12p, a gate valve 12g is provided along the side wall of the processing container 12.

In the processing container 12, a support unit 15 extends upward from the bottom portion of the processing container 12. The support unit 15 has a substantially cylindrical shape, and is formed of an insulating material such as ceramics. A placement table 16 is mounted on the support unit 15. The placement table 16 is supported by the support unit 15. The placement table 16 is configured to support a wafer W within the processing container 12. The placement table 16 includes a base 18 and an electrostatic chuck 20. The base 18 is made of a conductive material such as, for example, aluminum, and has a substantially disk shape. The base 18 has a function as a lower electrode.

In the base 18, a flow path 18f is provided. The flow path 18f is a flow path for a heat exchange medium. As the heat exchange medium, a liquid coolant or a coolant for cooling the base 18 by vaporization thereof (e.g., fluorocarbon) is used. The heat exchange medium is supplied to the flow path 18f from a chiller unit provided outside the processing container 12 through a pipe 23a. The heat exchange medium supplied to the flow path 18f is returned to the chiller unit through a pipe 23b. That is, the heat exchange medium is supplied so as to circulate between the flow path 18f and the chiller unit.

The electrostatic chuck 20 is provided on the base 18. The electrostatic chuck 20 includes a main body formed of an insulator and a film-shaped electrode provided inside the main body. A DC power supply is electrically connected to the electrode of the electrostatic chuck 20. When the voltage is applied from the DC power supply to the electrode of the electrostatic chuck 20, an electrostatic attractive force is generated between the wafer W disposed on the electrostatic chuck 20 and the electrostatic chuck 20. Due to the generated electrostatic attractive force, the wafer W is attracted to the electrostatic chuck 20, and held by the electrostatic chuck 20. A focus ring FR is disposed on the peripheral edge region of the electrostatic chuck 20. The focus ring FR has a substantially annular plate shape, and is formed of, for example, silicon. The focus ring FR is disposed so as to surround the edge of the wafer W.

The etching apparatus 10 is provided with a gas supply line 25. The gas supply line 25 supplies a heat transfer gas such as, for example, He gas, from the gas supply mechanism to a space between the upper surface of the electrostatic chuck 20 and the rear surface (lower surface) of the wafer W.

A cylindrical portion 28 extends upward from the bottom portion of the processing container 12. The cylindrical portion 28 extends along the outer periphery of the support unit 15. The cylindrical portion 28 is formed of a conductive material, and has a substantially cylindrical shape. The cylindrical portion 28 is connected to a ground potential. An insulating unit 29 is provided on the cylindrical portion 28. The insulating unit 29 has an insulating property, and is formed of, for example, quartz or ceramics. The insulating unit 29 extends along the outer periphery of the placement table 16.

The etching apparatus 10 further includes an upper electrode 30. The upper electrode 30 is provided above the placement table 16. The upper electrode 30 closes the upper opening of the processing container 12 together with a member 32. The member 32 has an insulating property. The upper electrode 30 is supported in the upper portion of the processing container 12 via the member 32. When a radio-frequency power supply 62 to be described later is electrically connected to the base 18, the upper electrode 30 is connected to the ground potential.

The upper electrode 30 includes a top plate 34 and a support 36. The lower surface of the top plate 34 faces the processing space. The top plate 34 is provided with a plurality of gas ejection holes 34a. Each of the plurality of gas ejection holes 34a penetrates the top plate 34 in the plate thickness direction (the vertical direction). The top plate 34 is formed of, for example, silicon, although it is not limited thereto. Alternatively, the top plate 34 may have a structure in which a plasma-resistant film is provided on the surface of a base material made of aluminum. The film may be a film formed by an anodic oxidation processing or a ceramic film such as, for example, a film formed of yttrium oxide.

The support 36 is a component that detachably supports the top plate 34. The support 36 may be formed of a conductive material such as, for example, aluminum. A gas diffusion chamber 36a is provided inside the support 36. A plurality of gas holes 36b extend downward from the gas diffusion chamber 36a. The plurality of gas holes 36b communicate with the plurality of gas ejection holes 34a, respectively. The support 36 is provided with a gas inlet 36c configured to guide a processing gas to the gas diffusion chamber 36a, and a gas supply pipe 38 is connected to the gas inlet 36c.

To the gas supply pipe 38, a gas source group 40 is connected through a valve group 42 and a flow rate controller group 44. The gas source group 40 includes a plurality of gas sources. The valve group 42 includes a plurality of valves, and the flow rate controller group 44 includes a plurality of flow rate controllers. Each of the plurality of flow rate controllers of the flow rate controller group 44 is a mass flow controller or a pressure control-type flow rate controller. Each of the plurality of gas sources of the gas source group 40 is connected to the gas supply pipe 38 through a corresponding valve of the valve group 42 and a corresponding flow rate controller of the flow rate controller group 44. The etching apparatus 10 is capable of supplying a gas from at least one source selected among the plurality of gas sources of the gas source group 40 into the processing container 12 at an individually adjusted flow rate.

A baffle plate 48 is provided between the cylindrical portion 28 and the side wall of the processing container 12. The baffle plate 48 may be constituted, for example, by coating an aluminum base material with a ceramic such as, for example, yttrium oxide. A large number of through holes are formed in the baffle plate 48. Under the baffle plate 48, an exhaust pipe 52 is connected to the bottom portion of the processing container 12. An exhaust device 50 is connected to the exhaust pipe 52. The exhaust device 50 has a pressure controller such as, for example, an automatic pressure control valve, and a vacuum pump such as, for example, a turbo molecular pump, so that the processing container 12c can be decompressed.

As illustrated in FIG. 1, the etching apparatus 10 further includes a radio-frequency power supply 62. The radio-frequency power supply 62 generates radio-frequency power for generating plasma by exciting the gas within the processing container 12. The radio-frequency power for plasma generation has a frequency within a range of 27 to 100 MHz, for example, a frequency of 60 MHz. The radio-frequency power supply 62 is connected to the base 18 through a matching circuit 64. The matching circuit 64 is a circuit configured to match the output impedance of the radio-frequency power supply 62 and the load side (base 18 side) impedance.

The etching apparatus 10 further includes a DC power supply 70. The DC power supply 70 generates a negative DC voltage (hereinafter, properly to as a "DC voltage" as appropriately) to be applied to the placement table 16 (the base 18). The DC power supply 70 is, for example, a monopolar-type variable DC power supply. The DC power supply 70 may be a bipolar-type variable DC power supply. The DC power supply 70 is electrically connected to the base 18 through a low-pass filter (LPF) 72. The DC voltage generated in the DC power supply 70 is used as a bias voltage for drawing ions in the plasma into the wafer W placed on the placement table 16. In addition, the DC power supply 70 is configured to be capable of changing the frequency (hereinafter, referred to as a "DC frequency" as appropriate) of the generated DC voltage under the control of a controller 95 to be described later. In addition, the DC power supply 70 is configured to be capable of changing the absolute value of the generated DC voltage under the control of the controller 95.

The etching apparatus 10 further includes the controller 95. The controller 95 includes a CPU (Central Processing Unit) and controls each unit of the etching apparatus 10. The controller 95 is connected with a user interface 96 including a keyboard on which a process manager performs an input operation of commands or the like to manage the etching apparatus 10 and a display on which the operating status of the etching apparatus 10 is visualized and displayed.

In addition, the controller 95 is connected with a storage unit 97 that stores a control program for realizing various processes executed by the etching apparatus 10 under the control of the controller 95, and a recipe stored with, for example, processing condition data. The storage unit 97 is, for example, a hard disk or a semiconductor memory. Further, the storage unit 97 may be a portable storage medium readable by a computer. In this case, the controller 95 acquires, for example, a control program stored in the storage medium via a device that reads data from the storage medium. The storage medium is, for example, a CD-ROM or a DVD.

The controller 95 controls each unit of the etching apparatus 10 and executes various processings in the etching apparatus 10 by reading an arbitrary recipe from the storage unit 97 and executing the recipe in response to, for example, an instruction from the user made via the user interface 96. For example, the controller 95 causes the etching apparatus 10 to perform an etching processing of forming holes or grooves on a wafer W by plasma.

In recent years, an aspect ratio required for holes or grooves formed in a wafer W by an etching processing is increasing. In the etching processing of holes or grooves having a high aspect ratio, as the etching processing progresses, the rectilinearity of the ions drawn into the workpiece decreases, and thus etching characteristics deteriorate.

Figure 2:
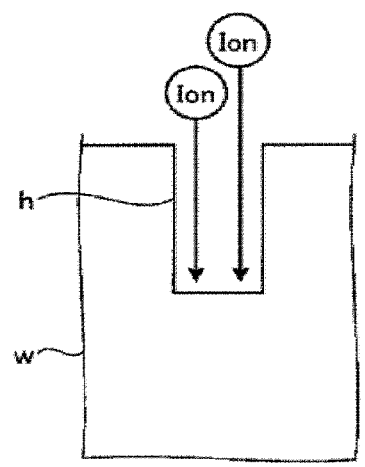
FIG. 2 is a view schematically illustrating the state of ions when an etching processing is started.

FIG. 2 is a view schematically illustrating the state of ions when an etching processing is started. For example, as illustrated in FIG. 2, since the depth of a hole h formed in a wafer W when an etching processing is started is relatively shallow, the rectilinearity of ions in the hole h is maintained.

Figure 3:
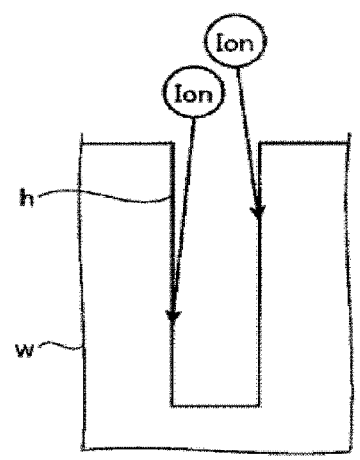
FIG. 3 is a view schematically illustrating the state of ions when an etching processing proceeds.

Meanwhile, when the etching processing proceeds, etching characteristics deteriorate. FIG. 3 is a view schematically illustrating the state of ions when an etching processing proceeds. For example, as illustrated in FIG. 3, as the etching progresses and the depth of the hole h becomes deeper, the rectilinearity of ions decreases in the hole h. Since the rectilinearity of ions decreases in the hole h as described above, the etching characteristics deteriorate. For example, since it is difficult for ions to reach the bottom of the hole h, an etching rate is lowered. Further, for example, since the side wall of the hole h is scraped more than necessary, defects in etching shape such as, for example, bending and bowing occur. In the case where radio-frequency power for bias is applied to the placement table 16, it is known that the rectilinearity of ions drawn into a wafer W increases as the frequency of the radio-frequency power for bias applied to the placement table 16 decreases. Therefore, in the case where a DC voltage is applied to the placement table 16 instead of the radio-frequency power for bias, it is believed that it is possible to suppress the rectilinearity of ions from deteriorating by lowering the frequency of the DC voltage applied to the placement table 16.

Therefore, when the etching processing on the wafer W is initiated, the controller 95 periodically applies a DC voltage from the DC power supply 70 to the placement table 16, and decreases the frequency of the DC voltage (i.e., the DC frequency) applied to the placement table 16 with the elapse of the processing time of the etching processing.

[Flow of Etching Method]

Figure 4:
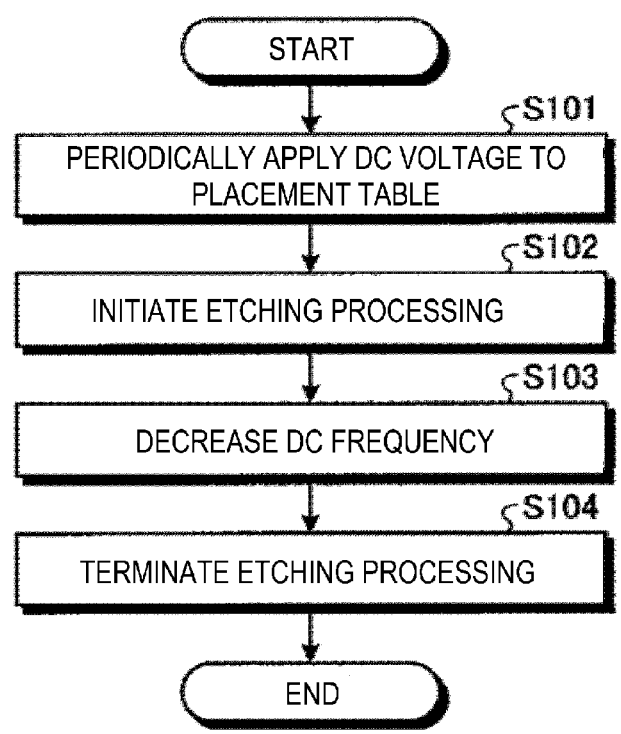
FIG. 4 is a flowchart illustrating an example of a flow of an etching method according to an embodiment.
Figure 5:
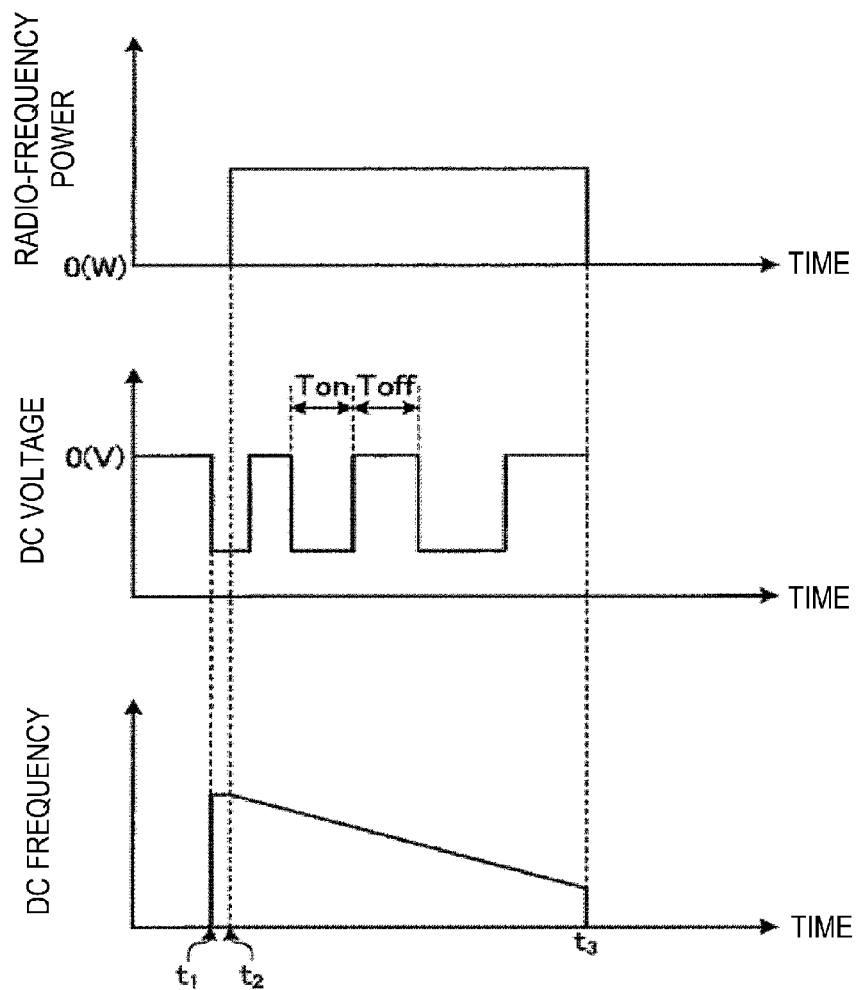
FIG. 5 is a view illustrating an example of a DC frequency decrease mode.

Next, a flow of an etching method executed by the etching apparatus 10 according to the present embodiment will be described. FIG. 4 is a flowchart illustrating an example of a flow of an etching method according to an embodiment. FIG. 5 is a view illustrating an example of a DC frequency decrease mode. Before the initiation of the flowchart illustrated in FIG. 4, a wafer W is loaded into the processing container 12, the loaded wafer W is placed on the placement table 16, a processing gas is supplied into the processing container 12, and the pressure within the processing container 12 is controlled to a predetermined pressure.

First, the controller 95 controls the DC power supply 70 to periodically apply a DC voltage from the DC power supply 70 to the placement table 16 (S101, time point $t_1$ in FIG. 5). Hereinafter, it is assumed that the length of the period during which the DC voltage is applied to the placement table 16 is $T_{on}$ and the length of the period during which the application of the DC voltage is stopped is $T_{off}$.

Subsequently, the controller 95 controls the radio-frequency power supply 62 to apply radio-frequency power of a predetermined frequency to the placement table 16 (time point $t_2$ in FIG. 5). As a result, plasma of the processing gas is generated in the processing container 12, and the etching processing for the wafer W is initiated by the generated plasma (S102).

Subsequently, while the etching processing is proceeding (that is, during time points $t_2$ to $t_3$ in FIG. 5), the controller 95 controls the DC power supply 70 to decrease the frequency of the DC voltage applied to the placement table 16 (i.e., the DC frequency) (S103, time points $t_2$ to $t_3$ in FIG. 5). The DC frequency is represented by $1/(T_{on}+T_{off})$.

In the present embodiment, the controller 95 continuously decreases the DC frequency with the elapse of the processing time of the etching processing from time points $t_2$ to $t_3$. As a result, even when the etching processing proceeds and the depth of the hole formed in the wafer W becomes deeper, the deterioration of the rectilinearity of the ions in the hole is suppressed.

Subsequently, the controller 95 controls the radio-frequency power supply 62 to stop the application of the radio-frequency power at time point $t_3$ when the hole having a predetermined depth is formed in the wafer W, and controls the DC power supply 70 to stop the application (time point $t_3$ in FIG. 5). Then, the supply of the processing gas is stopped, the processing container 12 is evacuated, and the wafer W is unloaded from the processing container 12. As a result, the etching processing for the wafer W is terminated (S104).

As described above, the plasma processing apparatus 10 according to an embodiment includes the placement table 16, the DC power supply 70, and the controller 95. A wafer W to be subjected to a plasma etching is placed on the placement table 16, and the placement table 16 serves as a lower electrode. The DC power supply 70 generates a negative DC voltage to be applied to the placement table 16. The controller 95 periodically applies a negative DC voltage to the placement table 16 from the DC power supply 70 when the etching processing for the wafer W placed on the placement table 16 is initiated. Then, the controller 95 decreases the frequency of the negative DC voltage applied to the placement table 16 with the elapse of the processing time of the etching processing. As a result, in the etching apparatus 10, even in the case where the depth of a hole or a groove formed in the wafer W becomes deeper as the etching processing proceeds, it is possible to suppress the deterioration of the rectilinearity of ions in the hole or the groove, and to suppress the deterioration of etching characteristics. For example, the energy of ions reaching the bottom of the hole or the groove increases, and the deterioration of the etching rate is suppressed. In addition, for example, etching of the side wall of a hole or a groove is suppressed, and a defect in an etching shape such as, for example, bending or bowing are suppressed.

Here, in order to suppress the deterioration in the rectilinearity of ions, it may be considered that a plurality of radio-frequency power supplies for generating a plurality of radio-frequency powers for bias having different frequencies are mounted in the etching apparatus, and that connection between the plurality of radio-frequency power supplies and the placement table 16 is selectively switched during the etching processing. However, when the plurality of radio-frequency power supplies are mounted in the etching apparatus, the apparatus configuration of the etching apparatus becomes complicated. In this regard, in the etching apparatus 10 according to an embodiment, it is possible to suppress deterioration in the rectilinearity of ions without mounting a plurality of radio-frequency power supplies in the etching apparatus 10. Consequently, in the etching apparatus 10, it is possible to suppress the deterioration of etching characteristics with a simple apparatus configuration in which the frequency of the negative DC voltage periodically applied from the DC power supply 70 to the placement table 16 is decreased with the elapse of the processing time of the etching processing.

In the above-described embodiments, the controller 95 continuously lowers the frequency of the negative DC voltage applied to the placement table 16 with the elapse of the processing time of the etching processing, but the disclosed technology it is not limited thereto. For example, the controller 95 may gradually lower the frequency of the negative DC voltage applied to the placement table 16 with the elapse of the processing time of the etching processing. The time widths of respective steps of decreasing the frequency of the negative DC voltage applied to the placement table 16 may be the same or different. Further, the controller 95 may decrease the frequency of the negative DC voltage applied to the placement table 16 from a first frequency to a second frequency lower than the first frequency at a time point when a predetermined time has elapsed since the etching processing was initiated.

In addition, in the above-described etching apparatus 10, the controller 95 may increase or decrease the absolute value of the negative DC voltage applied to the placement table 16 with the elapse of the processing time of the etching processing. For example, when the frequency of the negative DC voltage applied to the placement table 16 from the DC power supply 70 decreases with the elapse of the processing time of the etching processing, the frequency of switching on and off of the DC power supply 70 decreases, and thus the amount of heat generated by the DC power supply 70 decreases. In this case, the controller 95 controls the DC power supply 70 to increase the absolute value of the negative DC voltage applied to the placement table 16 with the elapse of the processing time of the etching processing. As a result, in the etching apparatus 10, it is possible to further suppress deterioration of etching characteristics even in the case where the etching processing progresses and the depth of the hole or the groove formed in the wafer W becomes deeper. For example, by increasing the absolute value of the negative DC voltage applied to the placement table 16, the number of ions reaching the bottom of the hole or the groove is increased, and the deterioration of the etching rate is suppressed.

When the absolute value of the negative DC voltage applied to the placement table 16 is increased, positive ions in the plasma are drawn into the wafer W, whereby the potential of the plasma is lowered. When the potential of the plasma is lowered, the electric potential of the wafer W fluctuates in order to maintain the electrical neutrality between the plasma and the wafer W, and thus the potential difference between the wafer W and the placement table 16 on which the wafer W is placed increases. As a result, discharge may occur between the placement table 16 and the wafer W in some cases. Therefore, in the etching apparatus 10, the control of the DC power supply 70 may be performed depending on the potential difference between the placement table 16 and the wafer W. For example, in the etching apparatus 10, the controller 95 calculates the potential difference between the placement table 16 and the wafer W after increasing the absolute value of the negative DC voltage applied to the placement table 16. For calculating the potential difference between the placement table 16 and the wafer W, for example, the voltage of the wafer W measured by a measurement device disposed in the vicinity of the focus ring FR surrounding the wafer W is used. Then, when the calculated potential difference exceeds a predetermined threshold, the controller 95 controls the DC power supply 70 so as to shift the value of the negative DC voltage applied to the placement table 16 by a shift amount for decreasing the potential difference. This makes it possible to suppress the occurrence of discharge between the placement table 16 and the wafer W.

According to the present disclosure, it is possible to suppress the deterioration of etching characteristics with a simple apparatus configuration.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An etching apparatus comprising:
    a placement table serving as a lower electrode and configured to place a workpiece to be subjected to an etching processing thereon;
    a DC power supply configured to generate a negative DC voltage applied to the placement table; and
    a controller configured to: periodically apply a negative DC voltage to the placement table from the DC power supply when the etching processing on the workpiece placed on the placement table is initiated; and decrease a frequency of the negative DC voltage applied to the placement table with an elapse of processing time of the etching processing.

2. The etching apparatus according to claim 1, wherein the controller decreases the frequency of the negative DC voltage applied to the placement table continuously or stepwise with an elapse of processing time of the etching processing.

3. The etching apparatus according to claim 2, wherein the controller increases or decreases an absolute value of the negative DC voltage applied to the placement table with the elapse of the processing time of the etching processing.

4. The etching apparatus according to claim 3, wherein the controller calculates a potential difference between the placement table and the workpiece after increasing the absolute value of the negative DC voltage applied to the placement table, and when the potential difference exceeds a predetermined threshold, the controller controls the DC power supply so as to shift a value of the negative DC voltage applied to the placement table by a shift amount for decreasing the potential difference.

5. The etching apparatus according to claim 1, wherein the controller decreases the frequency of the negative DC voltage applied to the placement table from a first frequency to a second frequency lower than the first frequency at a time point when a predetermined time has elapsed after initiation of the etching processing.

6. The etching apparatus according to claim 1, wherein the controller increases or decreases an absolute value of the negative DC voltage applied to the placement table with the elapse of the processing time of the etching processing.

7. The etching apparatus according to claim 1, wherein the controller calculates a potential difference between the placement table and the workpiece after increasing the absolute value of the negative DC voltage applied to the placement table, and when the potential difference exceeds a predetermined threshold, the controller controls the DC power supply so as to shift a value of the negative DC voltage applied to the placement table by a shift amount for decreasing the potential difference.

8. An etching method comprising:
    periodically applying a negative DC voltage to a placement table serving as a lower electrode and configured to place a workpiece thereon from a DC power supply configured to generate the negative DC voltage applied to the placement table when an etching processing is initiated on the workpiece placed on the placement table; and
    decreasing a frequency of the negative DC voltage applied to the placement table from the DC power supply with an elapse of processing time of the etching processing.

* * * * *